(12) United States Patent
Park et al.

(10) Patent No.: US 7,221,045 B2
(45) Date of Patent: May 22, 2007

(54) FLAT CHIP SEMICONDUCTOR DEVICE AND MANUFACTURING METHOD THEREOF

(75) Inventors: Kwang-suk Park, Yongin-si (KR); Jung-do Kim, Yongin-si (KR)

(73) Assignee: Samsung Techwin Co., Ltd.

( * ) Notice: Subject to any disclaimer, the term of this patent is extended or adjusted under 35 U.S.C. 154(b) by 0 days.

(21) Appl. No.: 11/133,613

(22) Filed: May 20, 2005

(65) Prior Publication Data
US 2006/0049517 A1   Mar. 9, 2006

(30) Foreign Application Priority Data
Sep. 4, 2004   (KR) ............. 10-2004-0070620

(51) Int. Cl.
*H01L 23/495* (2006.01)

(52) U.S. Cl. ............. 257/676; 257/738; 257/778; 257/779; 257/E23.02; 257/E23.021; 257/E23.023

(58) Field of Classification Search ............. None
See application file for complete search history.

(56) References Cited

U.S. PATENT DOCUMENTS 6,388,336 B1 * 5/2002 Venkateshwaran et al. . 257/779
6,621,152 B2 * 9/2003 Choi et al. ............. 257/678
6,750,551 B1 * 6/2004 Frutschy et al. ............. 257/785

OTHER PUBLICATIONS

Charles A. Harper, Electronic Packaging and Interconnection Handbook, 2000, The Mcgraw-Hill companies, Inc., Third Edition, p. 6.1.*

* cited by examiner

*Primary Examiner*—Minhloan Tran
*Assistant Examiner*—Leslie Pilar Cruz
(74) *Attorney, Agent, or Firm*—Tuchman & Park LLC

(57) ABSTRACT

A flip chip semiconductor device having an improved structure and a method of manufacturing the flip chip semiconductor device, in which a semiconductor chip can be more securely joined to a lead frame while preventing contact defects between the two. The flip chip semiconductor device includes: a semiconductor chip having electrode pads formed on one side; conductive bumps formed on the electrode pads of the semiconductor chip; and a lead frame including a plurality of leads, the ends of which are electrically connected to the conductive bumps, wherein each of the leads has at least one groove formed thereon, and a solder plating layer is provided on the leads in and about the groove and melted to secure the connection with the conductive bumps.

7 Claims, 5 Drawing Sheets

FLAT CHIP SEMICONDUCTOR DEVICE AND MANUFACTURING METHOD THEREOF

BACKGROUND OF THE INVENTION

This application claims priority of Korean Patent Application No. 10-2004-0070620, filed on Sep. 4, 2004, in the Korean Intellectual Property Office, the disclosure of which is incorporated herein in its entirety by reference.

FIELD OF THE INVENTION

The present invention relates to a flip chip semiconductor device and a manufacturing method thereof, in which contact defects between the semiconductor chip and lead frame can be reduced.

DESCRIPTION OF THE RELATED ART

As time passes, semiconductor packages (devices) are becoming smaller and more integrated, and they are also manufactured in a wide variety of shapes. According to the method of connection, semiconductor packages are typically classified in wire bonding types or flip chip bonding types. A wire bonding type package uses conductive bonding wires to connect the electrodes of the semiconductor chip to the leads of a lead frame, while a flip chip bonding type package uses conductive bumps, disposed on the electrode pads of the semiconductor chip, to connect the semiconductor chip to the leads or to connect the semiconductor chip directly to connection terminals of a circuit board. The flip chip bonding type package has a shorter electrical connection path than the wire bonding type package, and provides a superior thermal and electrical characteristic and a smaller package size, thus making it a favorable choice for use in modern wireless communication devices utilizing a GHz frequency range.

FIG. 1 is a cross-sectional view of a micro leadless package (MLP) type flip chip semiconductor package. Conductive bumps 25 are formed on an electrode pad (shown in FIG. 2 to be described later) of a semiconductor chip 21, and the semiconductor chip 21 is faced down and the conductive bumps 25 are electrically connected to the corresponding end portions of the leads 11 of a lead frame. The lead frame may include at its central location a die pad 15, on which the semiconductor chip 21 is mounted with the conductive bumps 25 forming a heat dissipation path from the semiconductor chip 21 to the die pad 15. Partial etching portions 11a and 15a are respectively formed on the lower end portions of the leads 11 and the lower outer portions of the die pad 15. A mold resin 30 surrounds the semiconductor chip 21 and the lead frame except the unetched bottom surfaces of the leads 11 and the die pad 15, which are exposed to the outside. A solder layer (shown in FIG. 2 to be described later) is formed on the exposed portions, and an electric connection between the semiconductor package and an external circuit board can be made through the solder layer.

FIG. 2 is an enlarged view of portion A in FIG. 1, illustrating a structure and method of coupling the semiconductor chip and the lead frame shown in FIG. 1. A protective layer 23 is formed under the electrode pad 22 and the semiconductor chip 21 with the exception of an open portion 26 of the electrode pad 22. An under bump metallurgy (UBM) portion 24 is formed around the open portion 26, and the conductive bump 25 is disposed under the UBM portion 24, through which the semiconductor chip 21 is electrically connected with the corresponding lead 11. A solder plating layer 13 is disposed on the end portion of the lead 11 corresponding to the location of the conductive bump 25, and the solder plating layer 13 is fused with the conductive bump 25 through a reflow process, which combines them electrically and mechanically with one another. More particularly as shown in FIG. 3, flux 14 is first applied to the corresponding solder plating layer 13 of the leads 11 before the reflow process for facilitating fusion of the conductive bump 25 to the solder plating layer 13.

The lead frame is often warped during the process of fabricating the lead frame, and thus an accurate planarity between the leads 11 cannot be maintained as shown in FIG. 3, thus causing a height variation (e) among the leads 11. In this case, the conductive bump 25 disposed on the semiconductor chip 21 cannot be completely joined to the corresponding lead 11, thus causing a failure in connection between the conductive bump 25 and the corresponding lead 11.

Occasionally, as shown in FIG. 4, the solder 13 that is fused in the reflow process can flow and escape from the connection junction, and causes a defective contact between the conductive bump 25 and the lead 11. If the solder 13 contacts with an adjacent lead 11, a short-circuit occurs between the leads 11.

SUMMARY OF THE INVENTION

The present invention provides a flip chip semiconductor device having an improved structure, which allows the semiconductor chip to be securely coupled to the lead frame while preventing defective contacts between them, and also provides a method of manufacturing the flip chip semiconductor device.

The present invention also provides a flip chip semiconductor device and a manufacturing method thereof, which can eliminate short-circuits between leads and also simplify the manufacturing processes.

According to one aspect of the present invention, a flip chip semiconductor device comprises: a semiconductor element having a plurality of electrodes arranged on one side; a plurality of conductive bumps disposed on the corresponding electrodes of the semiconductor element; a lead frame including a plurality of leads, at least some of the leads each having at least one groove formed thereon; and a solder material disposed in and around the groove of the leads and electrically connecting the leads with the corresponding conductive bumps.

The groove is preferably formed on a central area at the end of the lead.

The solder material may contain a metal selected from pure Sn, an alloy of Sn and Cu, an alloy of Sn and Ag, and an alloy of Sn and Bi.

The electrodes and the corresponding conductive bumps of the semiconductor element may be connected to one another via an intermediate metallic member.

According to another aspect of the present invention, a method of making a flip chip semiconductor device comprises: providing a lead frame, the lead frame including a plurality of leads arranged about a central area of the lead frame, each of the leads having at least one groove formed thereon; forming a solder plating layer on the leads at locations covering the grooves of the leads; applying a flux material on the solder plating layer; positioning conductive bumps of a semiconductor element on the solder plating layer covered with the flux; and heating the solder plating layer to melt the solder plating layer and connect the solder plating layer to the conductive bumps.

In providing the lead frame, the plurality of leads and grooves may be simultaneously etched in shape.

In forming the solder plating layer, the solder plating layer may fill the grooves in the leads and protrude to a predetermined height from the lead.

By heating the solder plating layer, the melted solder plating layer is collected about the grooves of the leads by a surface tension force and raises the height of the solder plating layer such that the connection of the solder plating layer with the conductive bumps is facilitated.

BRIEF DESCRIPTION OF DRAWINGS

The above and other features and advantages of the present invention will become more apparent by describing in detail exemplary embodiments thereof with reference to the attached drawings in which.

DETAILED DESCRIPTION OF PREFERRED EMBODIMENTS

Figure 1:
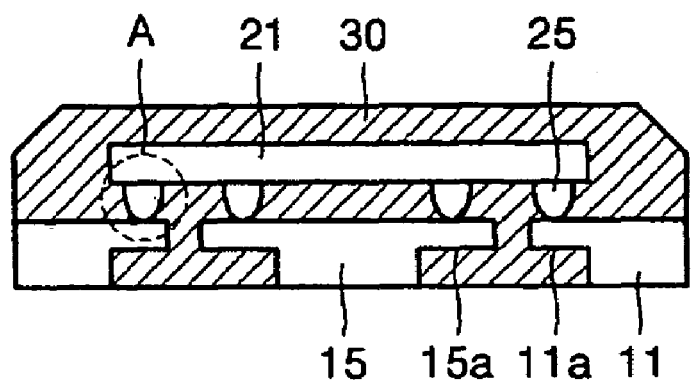
FIG. 1 is a schematic cross-sectional view of a conventional flip chip semiconductor package.
Figure 2:
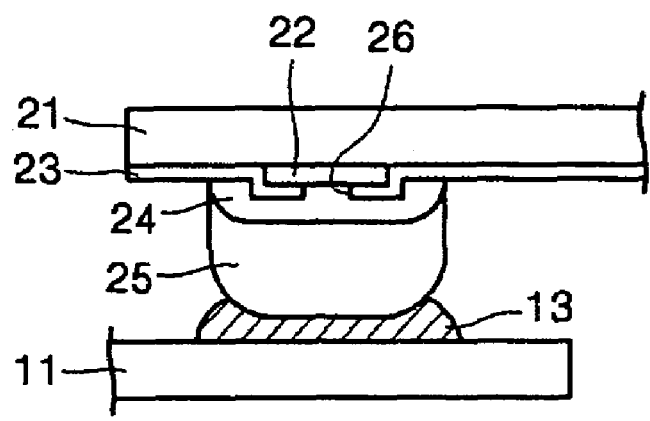
FIG. 2 is an enlarged cross-sectional view of part "A" of FIG. 1.
Figure 5:
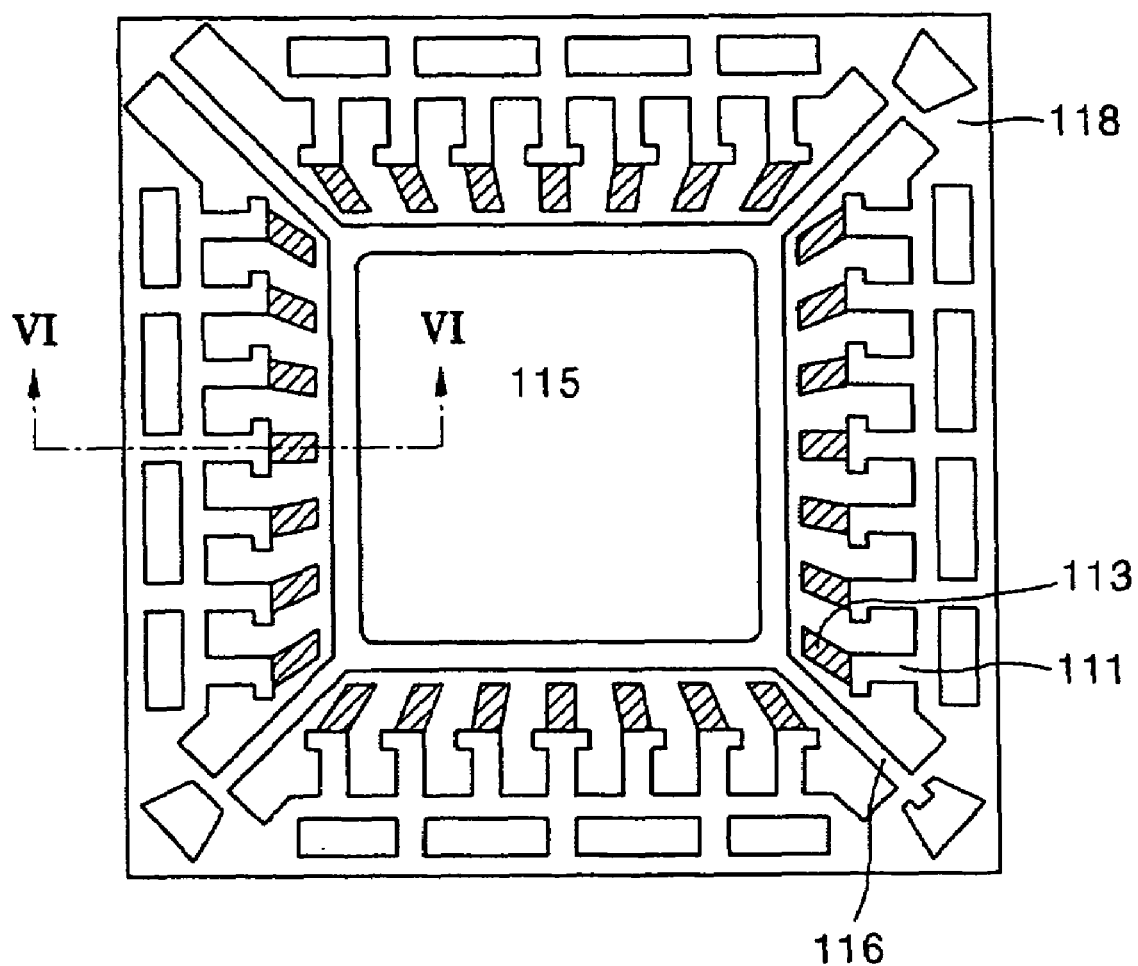
FIG. 5 is a schematic and enlarged perspective view of a lead frame for use in a flip chip semiconductor package and constructed according to one embodiment of the present invention.

FIG. 5 is a perspective view of a lead frame for use in a flip chip semiconductor device constructed according to one embodiment of the present invention. The lead frame includes a die pad 115 formed in the center of the frame, a plurality of leads 111 formed around the die pad 115, a side rail or outer frame 118 forming a base frame of the lead frame, and tie bars 116 connected to the side rail 118 to support the die pad 115. Partial etching portions (as shown in FIG. 1) are formed under the end of each of the leads 111 and outer lower portions of the die pad 115 in a manner such that the partially etched portions of the leads 111 and the die pad 115 face each other, and a solder plating layer 113 is disposed on the end of each of the leads 111 to electrically connect the leads 111 to a semiconductor chip or element (shown in FIGS. 6 and 7). It is further noted that the side rail 118 and the tie bars 116 are to be ultimately removed in a package assembly process, which is described later in detail.

In the drawings, a lead frame of only the type for use in a micro leadless package (MLP) is illustrated with reference to FIG. 5, but the present invention is not limited to such a particular structure of the lead frame as shown.

Figure 6:
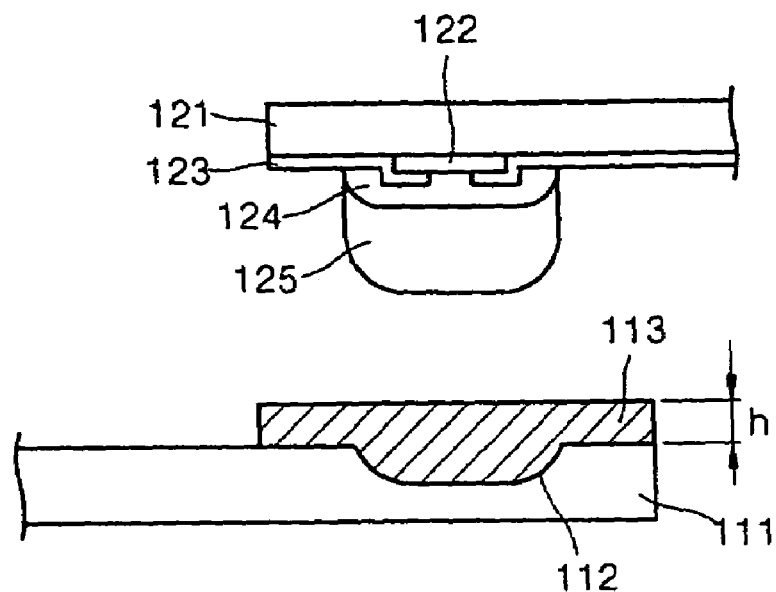
FIG. 6 is a schematic cross-sectional view of the lead frame taken along line VI—VI of FIG. 5, before mounting of a semiconductor chip on the lead frame.

FIG. 6 is a schematic, cross-sectional view of the lead frame of FIG. 5 taken along the line VI—VI, which also shows a semiconductor chip (or semiconductor element) before mounting on the lead frame. A groove 112 is formed at the end of each lead 111, to which the conductive bump 125 is coupled. The groove 112 can be provided at the time the base metal of the lead frame is formed. For example, the groove 112 can be formed by etching the ends of the leads 111 at the time the lead frame is etched in shape. The groove 112 receives a portion of the solder plating layer 113 that is melted in the reflow process, and prevents the solder plating layer 113 from escaping or displacing from the location for joining with the conductive bump 125. This feature will be further described later.

The solder plating layer 113 is formed around the ends of the leads 111 where the groove 112 is located, in a manner filling the groove 112 and having a predetermined height (h) from the surface of the leads 111. The solder plating layer 113 is to be melted in the reflow process, which will be described later, to join with the conductive bump 125 formed on the semiconductor chip 121. Therefore, it is desirable that the melting point of the solder plating layer 113 is lower than that of the conductive bump 125. The solder plating layer 113 can be formed of any suitable material known in the art which can be melted to join with the conductive bump 125. For example, pure tin (Sn), an alloy of Sn and Cu for a middle temperature application, an alloy of Sn and Ag for a middle temperature application, and an alloy of Sn and Bi for a low temperature application, can be used as the material for the solder plating layer 113.

Figure 7:
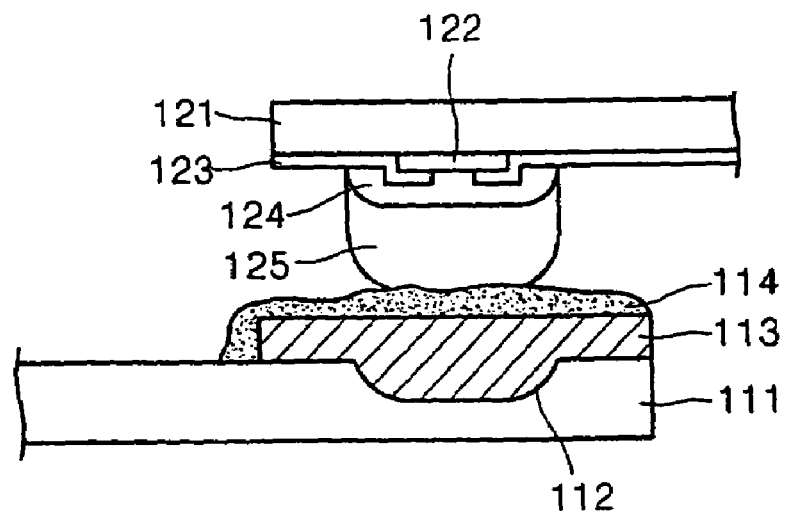
FIG. 7 is a schematic cross-sectional view similar to FIG. 6 and showing the state that the semiconductor chip is mounted on the lead frame.

Referring to FIG. 7, a flux 114 is applied on the solder plating layer 113. The flux is an organic medium which removes an oxide layer from the solder plating layer 113 and helps the melted solder plating layer 113 to attach to the conductive bump 125 in the reflow process. In addition, the flux further facilitates locating the conductive bump 125 of the semiconductor chip 121 onto the lead 111 before the reflow process is performed.

Since the flux is not conductive, it cannot cause short-circuits even if it flows into the neighboring leads in the reflow process. Therefore, when applying the flux, there is no critical need to accurately control the position or amount of the flux, and the flux applying operation can be performed relatively easily. The flux is removed by cleaning after the reflow process.

A protective layer 123 is formed on the bottom surface of the semiconductor chip 121, and a part of the protective layer 123 is removed to expose an electrode pad 122 of the semiconductor chip 121. Since it is difficult for the conductive bump 125 to be joined with the electrode pad 122, formed of aluminum, due to the difference in their physical properties, an under bump metallurgy (UBM) layer 124 is formed as a connection medium between the electrode pad 122 and the conductive bump 125. The UBM layer 124 can be formed of, for example, a chrome (Cr) layer that can be easily attached to the electrode pad, a copper (Cu) layer that has a superior solder wettability, and/or a Cr—Cu layer providing a firm interface between the Cr layer and the Cu layer. In addition, an Ag layer can be formed on the outermost surface of the UBM 124 as a protective layer. The UBM layer 124 is typically formed by sputtering or electroless plating.

Preferably, the conductive bump 125 for the flip chip bonding can be a solder bump containing at least Sn (for example, a Sn/Pb alloy bump), or a Ni/Au bump formed with a Ni bump having a Au plating layer applied thereon. However, the conductive bump 125 of the present invention is not limited to these particular type of bumps.

Figure 8:
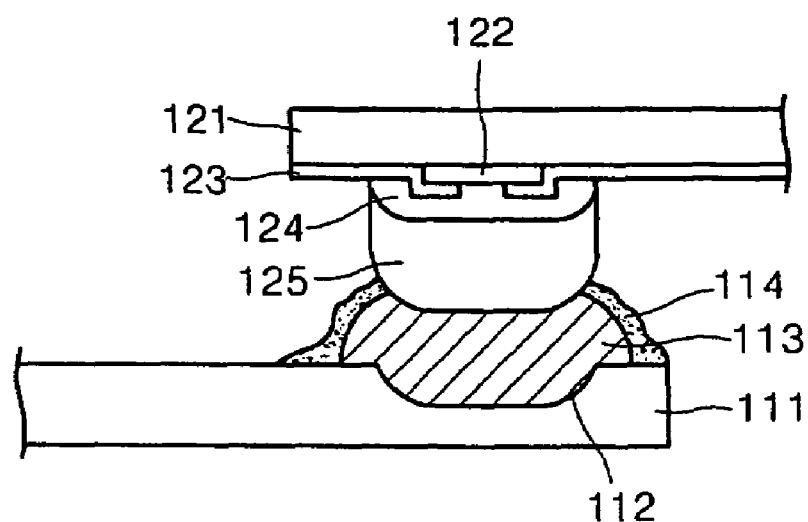
FIG. 8 is a schematic cross-sectional view showing the state that the semiconductor chip is coupled to the lead frame.

The semiconductor chip 121, on which the conductive bumps 125 are formed, is seated on the solder plating layer 113 containing the flux 114 applied thereon, and the semiconductor chip 121 is held in place by the flux 114. Referring now to FIG. 8, after the semiconductor chip 121 is placed on the lead frame, the solder plating layer 113 of the leads 111 is heated and melted through the reflow process, and the melted solder joins with the conductive bumps 125. The solder melted by the reflow process has a droplet or hemispherical shape due to the surface tension, and is condensed or collected in the particular region around the groove 112. Each droplet of melted solder has a suitable height allowing it to sufficiently contact the conductive bump 125.

Figure 3:
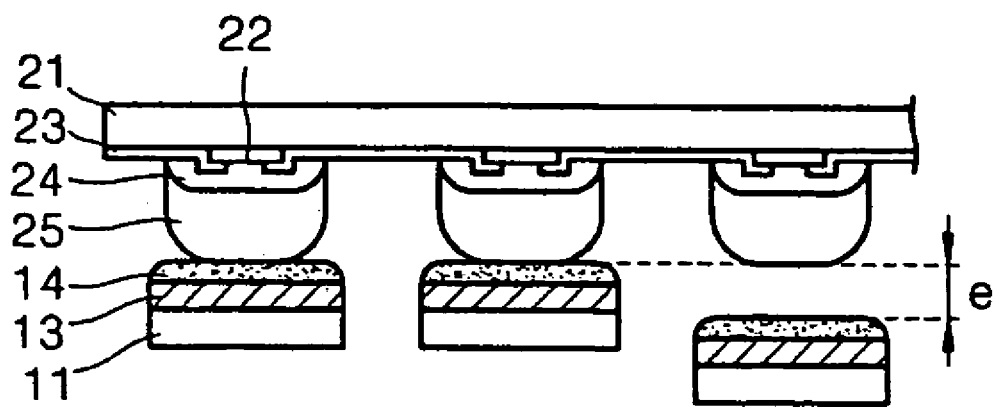
FIG. 3 is a schematic cross-sectional view illustrating a failure in contact between a conductive bump of the semiconductor chip and the lead frame, according to the conventional flip chip semiconductor package.
Figure 4:
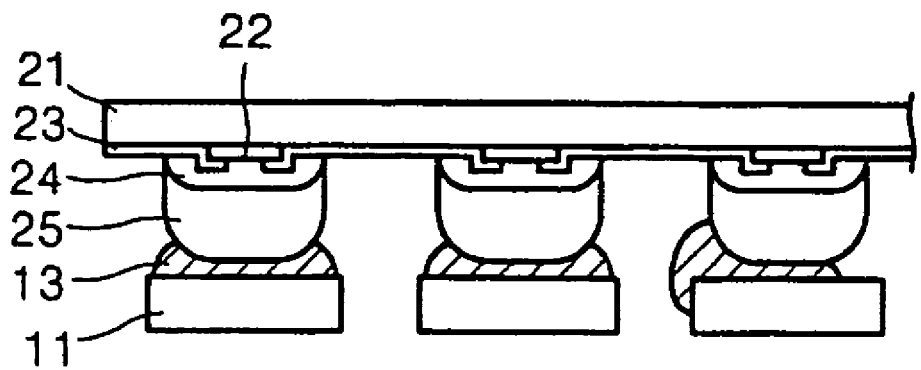
FIG. 4 is a schematic cross-sectional view illustrating a defective coupling of the semiconductor chip to the lead frame according to the conventional art.

As mentioned before, the lead frame is often warped to some extent and the thickness of the solder plating layer can vary, due to limitations in the manufacturing process, and accordingly, gaps may be present between the conductive bumps and the solder plating layer in case of using the conventional flip chip bonding method (as shown in FIG. 3). However, according to the present invention, when the solder plating layer 113 is melted, the melted solder is collected around each groove 112 due to the surface tension and rises up to have a sufficient height for allowing a good contact between the conductive bump 125 and the melted solder plating layer 113 even if there is a gap between them.

Although not shown in the drawings, after the semiconductor chip is mounted on the lead frame through the reflow process, a predetermined part of the lead frame and the semiconductor chip are sealed by a mold resin such as epoxy molding compound (EMC), and the side rail 118 and at least some portion of the tie bars 116 (shown in FIG. 5) that were formed integrally with the lead frame are removed.

Figure 9:
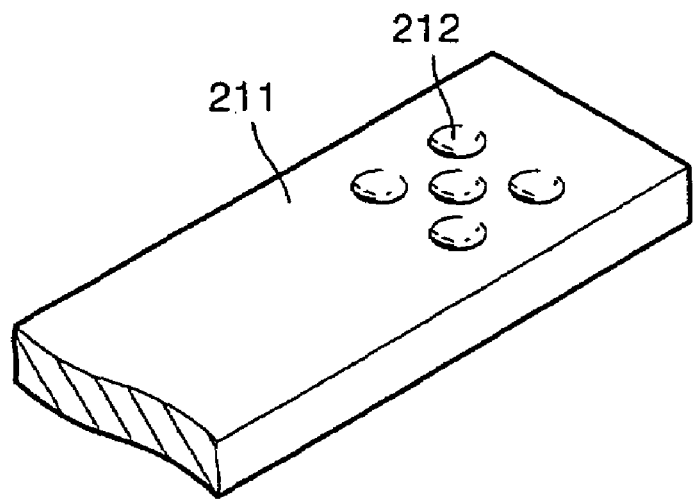
FIG. 9 is an enlarged perspective view of a part of the lead frame for use in a flip chip semiconductor package constructed according to another embodiment of the present invention.

As shown in FIG. 6, one groove 112 can be formed at the end of each lead 111, or alternatively as shown in FIG. 9, two or more grooves 212 can be formed in each lead 211. In either case, it is desirable that the groove(s) 112 or 212 are formed in a predetermined region and in a manner to restrict the flow of the melted solder plating layer and to confine it within a desired area.

The present invention has been described above in association with certain embodiments of the MLP type package, in which the leads are sealed in the mold resin, but the present invention can also be applied to other type of package structures.

According to the flip chip semiconductor package of the present invention as described above, due to the grooves formed at the end of the leads, the solder plating layer is restricted from moving out of position even when the solder plating layer is melted by the reflow process. This prevents the solder plating layer from floating or displacing from a designed position, which causes a defective contact between the conductive bump and the solder plating layer. Because the solder plating layer melted in the reflow process is collected in a small area in and around the groove by the surface tension of the molten solder while raising its height to reach any gaps from the conductive bump, the connection between the solder layer and the conductive bump can be significantly improved. As a result, the conductive bump and the solder can be firmly joined, even when a gap exists between the conductive bump and the solder plating layer. This alleviates the need for precisely controlling the planarity of the lead frame and the thickness of the solder plating layer, thereby simplifying the manufacturing process of the semiconductor device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flip chip semiconductor device comprising:
   a semiconductor element having a plurality of electrodes arranged on one side;
   a plurality of conductive bumps disposed on the corresponding electrodes of the semiconductor element;
   a lead frame including a plurality of leads, at least some of the leads each having at least one groove formed thereon; and
   a solder material disposed in and around the groove of the leads to a predetermined height over an upper surface of the leads, the solder material fused with the corresponding conductive bumps with the height of the solder material disposed around the groove risen to a risen height by the fusion due to a surface tension such that the risen height of the solder material provides a sufficient electrical connection with the corresponding conductive bumps while the solder material around the groove is restricted from being displaced out of position during the fusion due to the groove.

2. The semiconductor device of claim 1, wherein the groove is formed on a central area at the end of the lead.

3. The semiconductor device of claim 1, wherein the at least some of the leads each has one groove formed thereon.

4. The semiconductor device of claim 1, wherein the at least some of the leads each has plural grooves formed thereon.

5. The semiconductor device of claim 1, wherein all of the plurality of leads each has at least one groove formed thereon.

6. The semiconductor device of claim 1, wherein the solder material contains a metal selected from the group consisting of pure Sn, an alloy of Sn and Cu, an alloy of Sn and Ag, and an alloy of Sn and Bi.

7. The semiconductor device of claim 1, wherein the electrodes and the corresponding conductive bumps of the semiconductor element are connected to one another via an intermediate metallic member.

* * * * *

UNITED STATES PATENT AND TRADEMARK OFFICE
CERTIFICATE OF CORRECTION

| | | |
|---|---|---|
| PATENT NO. | : 7,221,045 B2 | |
| APPLICATION NO. | : 11/133613 | |
| DATED | : May 22, 2007 | |
| INVENTOR(S) | : Kwang-suk Park et al. | |

It is certified that error appears in the above-identified patent and that said Letters Patent is hereby corrected as shown below:

Title Page Item [54] and Column 1, lines 1-3 should read:

FLIP CHIP SEMICONDUCTOR DEVICE AND MANUFACTURING METHOD THEREOF

Signed and Sealed this

Seventeenth Day of July, 2007

JON W. DUDAS
*Director of the United States Patent and Trademark Office*